(12) United States Patent
Osanai et al.

(10) Patent No.: US 7,656,186 B2
(45) Date of Patent: Feb. 2, 2010

(54) CALIBRATION CIRCUIT, SEMICONDUCTOR DEVICE INCLUDING THE SAME, AND DATA PROCESSING SYSTEM

(75) Inventors: Fumiyuki Osanai, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 26 days.

(21) Appl. No.: 12/213,962

(22) Filed: Jun. 26, 2008

(65) Prior Publication Data
US 2009/0009213 A1 Jan. 8, 2009

(30) Foreign Application Priority Data
Jul. 4, 2007 (JP) ............... 2007-176270

(51) Int. Cl.
*H03K 17/16* (2006.01)
(52) U.S. Cl. .......................... 326/30; 326/87
(58) Field of Classification Search ............... 326/26, 326/27, 30, 82–87
See application file for complete search history.

(56) References Cited
U.S. PATENT DOCUMENTS

| 6,762,620 B2 * | 7/2004 | Jang et al. ............... 326/30 |
| 7,221,193 B1 * | 5/2007 | Wang et al. ............... 327/108 |
| 2008/0001624 A1 * | 1/2008 | Lee ............... 326/30 |
| 2008/0112246 A1 * | 5/2008 | Mei ............... 365/210.1 |

FOREIGN PATENT DOCUMENTS

| JP | 2002-152032 | 5/2002 |
| JP | 2004-032070 | 1/2004 |
| JP | 2005-159702 | 6/2005 |
| JP | 2006-203405 | 8/2006 |
| JP | 2007-110615 | 4/2007 |

\* cited by examiner

*Primary Examiner*—Don P Le
(74) *Attorney, Agent, or Firm*—McGinn IP Law Group, PLLC

(57) ABSTRACT

A calibration circuit includes: replica buffers; an up-down counter that changes impedance codes of the replica buffers; latch circuits each holding the impedance codes; an end-determining circuit that activates the latch circuits in response to a completion of impedance adjustments of the replica buffers; and a 32 tCK cycle counter that forcibly activates the latch circuits in response to a lapse of a predetermined period since issuance of the calibration command. Thereby, even when the adjustment is not completed during one calibration period, a subsequent calibration operation can be executed from a previous point.

7 Claims, 12 Drawing Sheets

CALIBRATION CIRCUIT, SEMICONDUCTOR DEVICE INCLUDING THE SAME, AND DATA PROCESSING SYSTEM

TECHNICAL FIELD

The present invention relates to a calibration circuit and a semiconductor device including the same, and, more particularly relates to a calibration circuit that adjusts an impedance of an output buffer, and a semiconductor device including the same. The present invention also relates to a data processing system having such a semiconductor device.

BACKGROUND OF THE INVENTION

In recent years, a significantly high data transfer rate is required for a data transfer between semiconductor devices (between CPUs and memories, for example). To accomplish the high data transfer rate, an amplitude of input/output signals is increasingly reduced. When the amplitude of the input/output signals is reduced, the required accuracy of an impedance to an output buffer becomes very severe.

The impedance of the output buffer varies depending on process conditions during the manufacturing. Also, during its actual use, the impedance of the output buffer is affected by a change in ambient temperature and a variation of a power source voltage. Thus, when high impedance accuracy is required for the output buffer, an output buffer having an impedance adjusting function is adopted (see Japanese Patent Application Laid-open Nos. 2002-152032, 2004-32070, 2006-203405, 2005-159702, and 2007-110615). The adjustment of the impedance of such an output buffer is performed using a circuit generally called a "calibration circuit".

As disclosed in Japanese Patent Application Laid-open Nos. 2006-203405, 2005-159702, and 2007-110615, the calibration circuit includes a replica buffer having a configuration substantially identical to that of the output buffer. When a calibration operation is performed, in a state where an external resistor is connected to a calibration terminal, voltage that appears in the calibration terminal is compared with a reference voltage, thereby adjusting the impedance of the replica buffer. When an adjustment result of the replica buffer is then reflected in the output buffer, the impedance of the output buffer is set to a desired value.

In the calibration operation, adjusting steps including the voltage comparison and impedance update of the replica buffer are executed for a plurality of number of times. Thereby, the impedance of the replica buffer is brought close to the desired value. However, when the impedance adjustment is not correctly completed within a period during which a calibration operations are performed (a calibration period), the adjustment content is discarded assuming that some abnormality is generated. As a result, even when some abnormality is generated in the calibration operation, the impedance adjustment in a wrong direction is prevented.

A certain amount of time is necessary for the voltage comparison in the calibration operation, in the impedance change of the replica buffer, and so on. Thus, when a frequency of an external clock is high, it is not possible to execute the adjusting step in each clock cycle. In this case, the external clock is divided to generate an internal clock having a lower frequency, and in synchronism therewith, the adjusting step can be executed.

However, the calibration period (=tZQCS) is usually defined by the number of external clock cycles (64 clock cycles, for example). As a result, the larger a frequency-dividing number of the external clock cycles, the smaller the number of adjusting steps executable during the calibration period. That is, the number of times that the internal clock becomes active during one calibration period, i.e., the number of adjusting steps is m/n times, where m denotes the number of external clock cycles defining the calibration period and n denotes the frequency-dividing number. When the frequency of the external clock becomes higher, it inevitably becomes necessary to increase the frequency-dividing number n. This further decreases the number of adjusting steps executable during one calibration period.

Accordingly, when the frequency of the external clock becomes very high, there can be a case that the impedance adjustment is not completed during one calibration period. As described above, when such a case occurs, the adjustment result is conventionally discarded assuming that the abnormality is generated. However, when the number of adjusting steps executable during one calibration period becomes significantly small due to improvement of frequency, it is probable that the case that the impedance adjustment is not completed during one calibration period often occurs.

In such a case, when the adjustment content is discarded each time the impedance adjustment fails, it becomes impossible to reach a target impedance.

SUMMARY OF THE INVENTION

The present invention has been achieved to solve such problems, and therefore an object of the present invention is to provide a calibration circuit capable of correctly executing a calibration operation even when a frequency of an external clock is high, and a semiconductor device including the same.

Another object of the present invention is to provide a data processing system having such a semiconductor device.

The above and other objects of the present invention can be accomplished by a calibration circuit for adjusting impedances of a pull-up circuit and a pull-down circuit included in an output buffer, comprising:

a first replica buffer having a circuit configuration substantially identical to that of one of the pull-up circuit and the pull-down circuit;

a second replica buffer having a circuit configuration substantially identical to that of an alternate one of the pull-up circuit and the pull-down circuit;

a counter circuit that changes first and second impedance codes each defining impedances of the first and second replica buffers;

first and second latch circuits each holding the first and second impedance codes;

a first end-determining circuit that activates the first latch circuit in response to an impedance of the first replica buffer reaching a predetermined level and activates the second latch circuit in response to an impedance of the second replica buffer reaching a predetermine level; and a second end-determining circuit that activates at least one of the first and second latch circuits in response to a lapse of a predetermined period since issuance of a calibration command, irrespective of whether the impedance of the first or second replica buffer reaches the predetermined level.

A semiconductor device according to the present invention includes said calibration circuit and the output buffer. A data processing system according to the present invention includes said semiconductor device.

In the present invention, the "predetermined period" is not limited to a period defined by an absolute time, and can be a period defined by the number of clocks. Further, a condition for determining whether the impedance "reaches the predetermined level" is not particularly limited. Accordingly, the condition includes also a case that it is determined that the impedance "reaches the predetermined level" on a condition that predetermined results continuously appear in a plurality of number of times of adjusting steps.

It is preferable that the predetermined period is substantially half a calibration period, and the second end-determining circuit switches the operation modes of the counter circuit in response to a lapse of the predetermined period from a start of the calibration operation. It is also preferable that the predetermined period is substantially identical to a calibration period, and the operation modes of the counter circuit are switched each time the calibration command is issued.

Thus, according to the present invention, irrespective of whether the impedance of the replica buffer reaches the predetermined level, without discarding an impedance code or adjustment content, the impedance code is fetched into the latch circuit. Accordingly, even when the impedance adjustment is not completed during one calibration period, a subsequent calibration operation can be executed from a previous point. Accordingly, even when a frequency of the external clock is high, if calibration commands are issued for a plurality of number of times, it becomes possible to reach a target impedance.

In addition, in the present invention, in response to the impedance of the replica buffer reaching the predetermined level, the impedance code is fetched into a latch circuit. As a result, it is possible to obtain higher impedance accuracy, as compared to a calibration circuit of a type in which a predetermined number of times of adjusting steps are forcibly executed.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
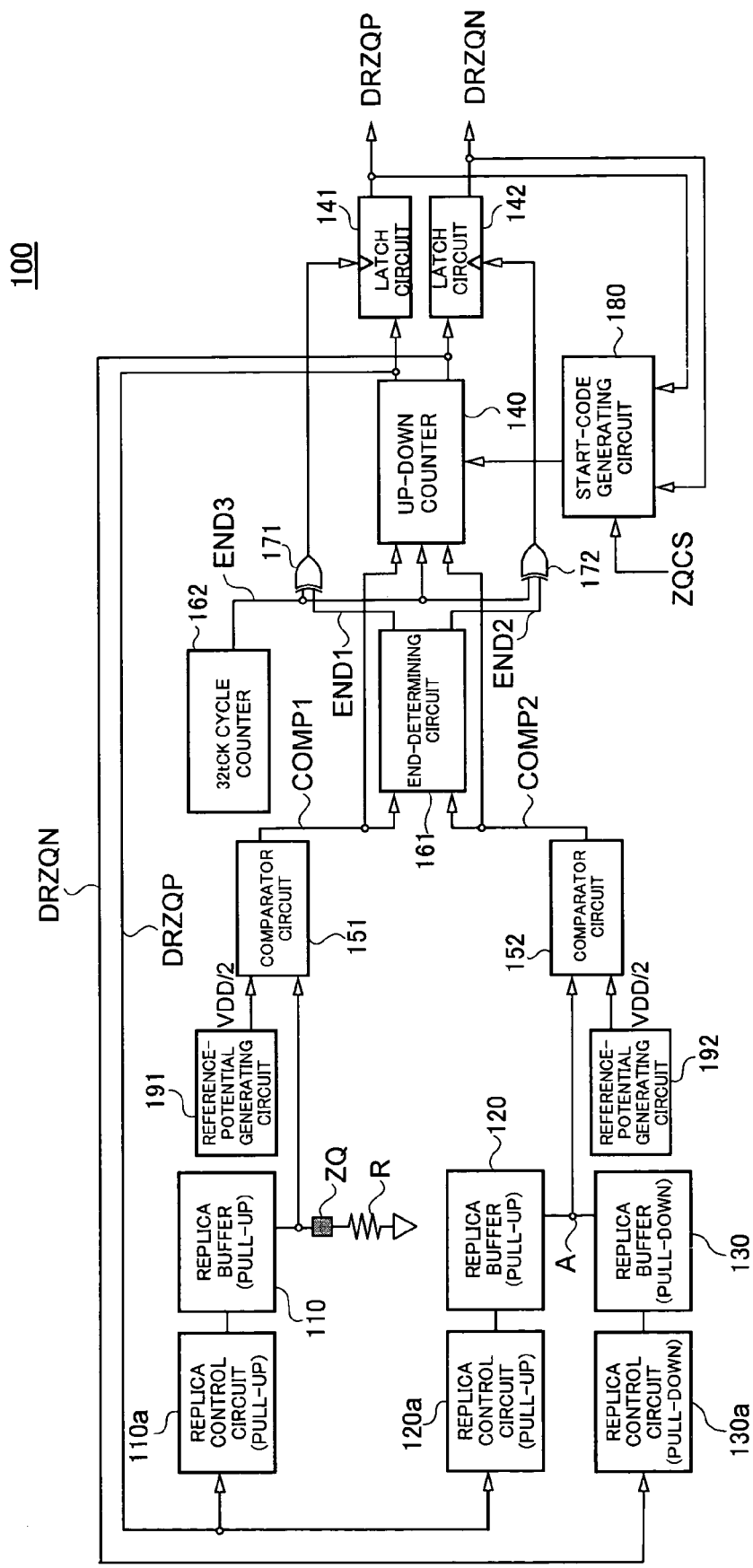
FIG. 1 is a circuit diagram of a calibration circuit according to a first preferred embodiment of the present invention.

FIG. 1 is a circuit diagram of a calibration circuit 100 according to a first preferred embodiment of the present invention.

As shown in FIG. 1, the calibration circuit 100 of the present embodiment includes replica buffers 110, 120, and 130, an up-down counter 140 for controlling the impedances of the replica buffers 110, 120 and 130, and latch circuits 141 and 142 for temporarily storing impedance codes generated by the up-down counter 140.

The replica buffers 110, 120, and 130 have the same circuit configuration as a part of an output buffer which will be described later. The output impedance is adjusted by using the replica buffers 110, 120, and 130 and the result is reflected in the output buffer. The impedance of the output buffer is thus set to the desired value. That is the function of the calibration circuit 100.

Figure 2:
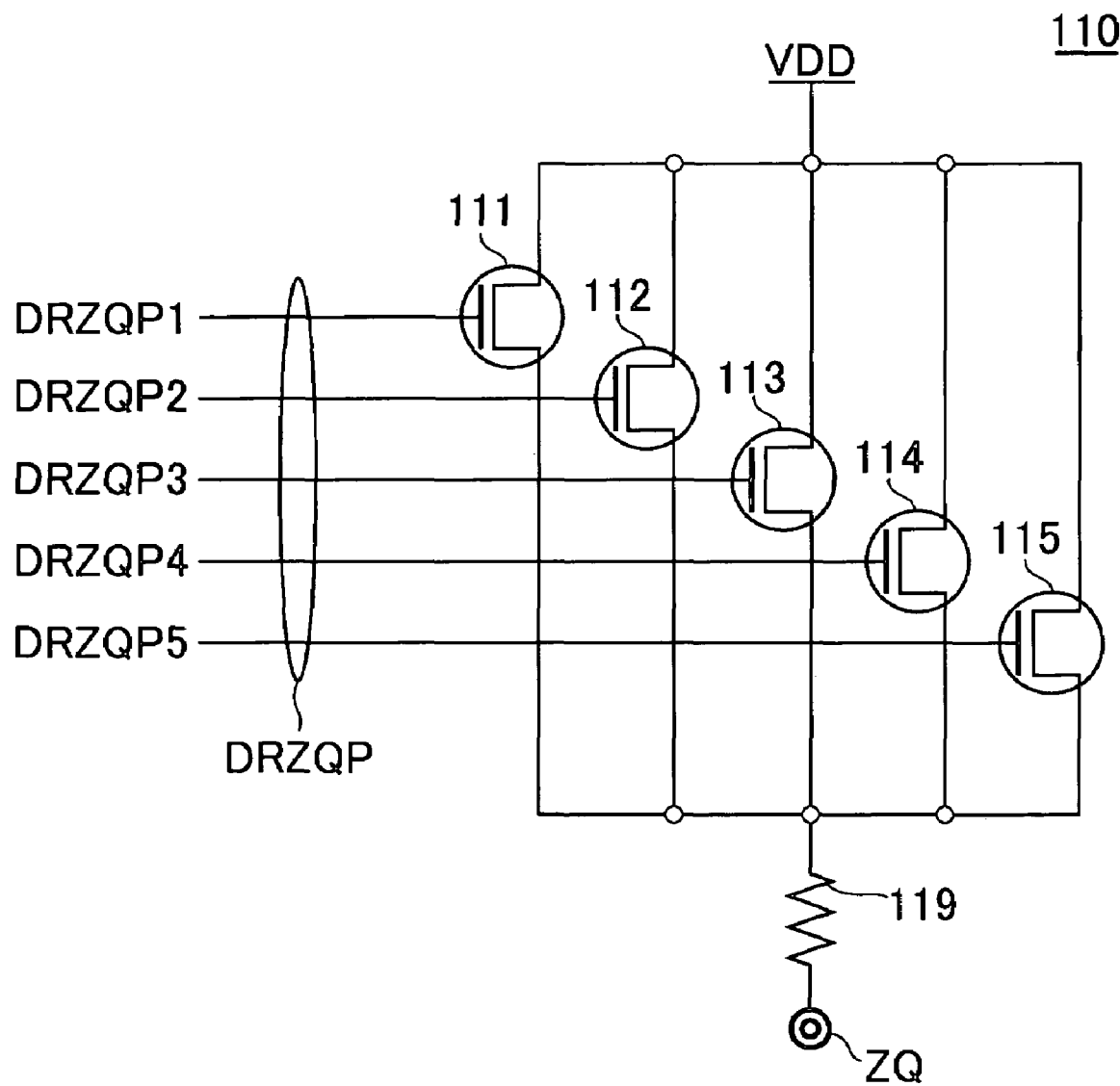
FIG. 2 is a circuit diagram of the replica buffer 110.

FIG. 2 is a circuit diagram of the replica buffer 110.

As shown in FIG. 2, the replica buffer 110 is formed by five P-channel MOS transistors 111 to 115 connected in parallel to a power source potential VDD and a resistor 119 with its one end being connected to the drains of the transistors. The other end of the resistor 119 is connected to a calibration terminal ZQ. The replica buffer 110 does not have a pull-down function. Instead, this buffer has only a pull-up function.

Impedance control signals DRZQP1 to DRZQP5 are supplied to the gate electrodes of the transistors 111 to 115, respectively. The impedance control signals DRZQP1 to DRZQP5 are provided via a replica control circuit 110a provided at a former stage of the replica buffer 110. Therefore, five transistors in the replica buffer 110 can perform on-off operation separately. In FIGS. 1 and 2, the impedance control signals DRZQP1 to DRZQP5 are collectively referred to as DRZQP. The replica control circuit 110a is provided in order to control a slew rate and so on of the impedance control signals DRZQP1 to DRZQP5. The same is true of the replica control circuits 120a and 130a described later.

The parallel circuit of the transistors 111 to 115 is designed so as to have predetermined impedance (e.g., 120Ω) in active state. Hoverer, because the on-resistance of the transistor varies depending on manufacturing conditions, environmental temperatures, and power source voltages during the operation, the desired impedance may not be obtained. To accomplish 120Ω of the impedance actually, the number of transistors to be turned on must be adjusted. The parallel circuit of a plurality of transistors is thus utilized.

To adjust the impedance closely over a wide range, W/L ratios (ratios of gate width to gate length) of the plurality of transistors constituting the parallel circuit are preferably different from one another. More preferably, a power of two weighting is performed upon the transistors. In view of this point, according to the present embodiment, when the W/L ratio of the transistor 111 is set to "1", the W/L ratios of the transistors 112 to 115 are "2", "4", "8", and "16", respectively (these W/L ratios do not represent actual W/L ratios but relative values, which will also apply to the following description.).

By selecting appropriately transistors to be turned on by the impedance control signals DRZQP1 to DRZQP5, the on resistance of the parallel circuit is fixed to about 120Ω regardless of variations in the manufacturing conditions and the temperature changes.

The resistance value of the resistor 119 is designed to be 120Ω, for example. Therefore, when the parallel circuits of the transistors 111 to 115 are turned on, the impedance of the replica buffer 110 is 240Ω as seen from the calibration terminal ZQ. For example, a tungsten (W) resistor is utilized for the resistor 119.

The replica buffer 120 has the same circuit configuration as the replica buffer 110 shown in FIG. 2 except that the other end of the resistor 119 is connected to a node A. Therefore, the impedance control signals DRZQP1 to DRZQP5 are provided to the gates of five transistors in the replica buffer 120 via the replica control circuit 120a.

Figure 3:
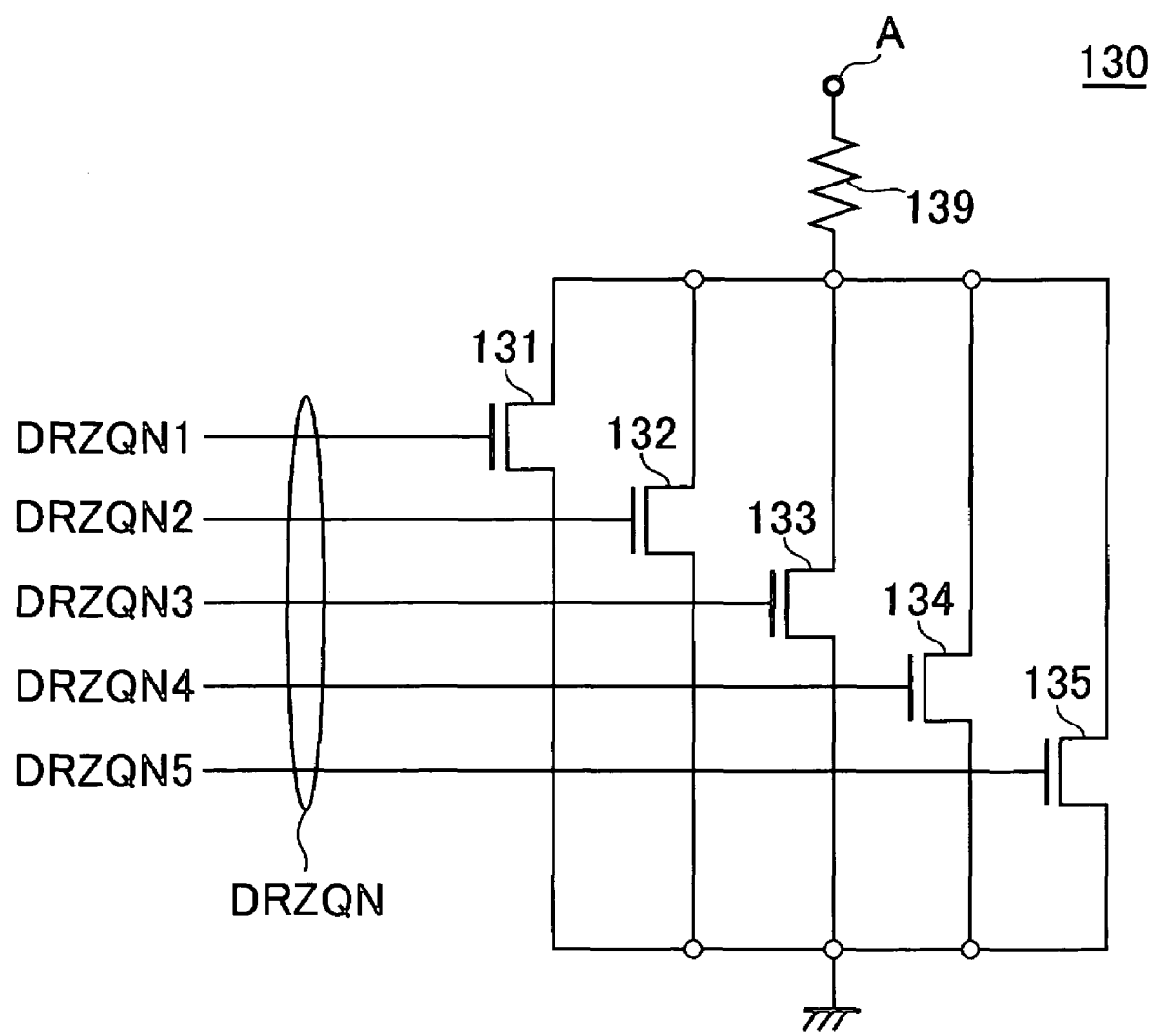
FIG. 3 is a circuit diagram of the replica buffer 130.

FIG. 3 is a circuit diagram of the replica buffer 130.

As shown in FIG. 3, the replica buffer 130 is formed by five N-channel MOS transistors 131 to 135 connected in parallel to a ground potential and a resistor 139 with its one end being connected to the drains of the transistors. The other end of the resistor 139 is connected to the node A. The replica buffer 130 does not have the pull-up function. Instead, this buffer has only the pull-down function.

Impedance control signals DRZQN1 to DRZQN5 are supplied to the gate electrodes of the transistors 131 to 135, respectively. The impedance control signals DRZQN1 to DRZQN5 are provided via a replica control circuit 130a provided at a former stage of the replica buffer 130. Therefore, five transistors in the replica buffer 130 can perform on-off operation separately. In FIGS. 1 and 3, the impedance control signals DRZQN1 to DRZQN5 are collectively referred to as DRZQN.

The parallel circuit of the transistors 131 to 135 is designed to have e.g., 120Ω at the time of conduction. The resistance value of the resistor 139 is designed to be e.g., 120Ω. When the parallel circuit of the transistors 131 to 135 is turned on, the impedance of the replica buffer 130 is, as seen from the node A, 240Ω like the replica buffers 110 and 120.

More preferably, like the transistors 111 to 115, the power of two weighting is performed upon the W/L ratios of the transistors 131 to 135. Specifically, when the W/L ratio of the transistor 131 is "1", the W/L ratios of the transistors 132 to 135 are set to "2", "4", "8", and "16", respectively.

Returning back to FIG. 1, the up-down counter 140 is a counter circuit capable of individually counting up and counting down a first impedance code configuring the impedance control signal DRZQP and a second impedance code configuring the impedance control signal DRZQN. That is, the up-down counter 140 has an operation mode of counting the first impedance code and an operation mode of counting the second impedance code. The switching is controlled by an end signal END3 outputted from a 32tCK cycle counter 162.

The first impedance code configuring the impedance control signal DRZQP is counted up and counted down based on a comparison signal COMP1, and the second impedance code configuring the impedance control signal DRZQN is counted up and counted down based on a comparison signal COMP2.

The comparison signal COMP1 is generated by a comparator circuit 151. The comparator circuit 151 compares a potential of the calibration terminal ZQ and a reference potential (VDD/2), and controls the up-down counter 140. More specifically, when the potential of the calibration terminal ZQ is higher than the reference potential, the comparator circuit 151 counts down the first impedance code, which increases the impedance of the replica buffer 110. On the contrary, when the potential of the calibration terminal ZQ is lower than the reference potential, the comparator circuit 151 counts up the first impedance code, which decreases the impedance of the replica buffer 110. The reference potential supplied to the comparator circuit 151 is generated by a reference-potential generating circuit 191.

The comparison signal COMP2 is generated by a comparator circuit 152. The comparator circuit 152 compares a potential of a contact node A and the reference potential (VDD/2), and controls the up-down counter 140. The contact node A is a node between the replica buffer 120 and the replica buffer 130. More specifically, when the potential of the contact node A is higher than the reference potential, the comparator circuit 152 counts up the second impedance code, which decreases the impedance of the replica buffer 130. On the contrary, when the potential of the contact node A is lower than the reference potential, the comparator circuit 152 counts down the second impedance code, which increases the impedance of the replica buffer 130. The reference potential supplied to the comparator circuit 152 is generated by a reference-potential generating circuit 192.

As shown in FIG. 1, the comparison signals COMP1 and COMP2 are supplied also to an end-determining circuit 161. The end-determining circuit 161 generates an end signal END1 in response to the impedance of the replica buffer 110 reaching a predetermined level, and generates an end signal END2 in response to the impedance of the replica buffer 130 reaching a predetermined level. Whether the impedances of the replica buffers 110 and 130 reach the predetermined level is determined by referring to the comparison signals COMP1 and COMP2, respectively. As one example, when the comparison signals COMP1 and COMP2 change, it can be determined that the impedances of the replica buffers 110 and 130 reach the predetermined level. Alternatively, when the comparison signals COMP1 and COMP2 change continuously for a plurality of number of times, it can be also determined that the impedances of the replica buffers 110 and 130 reach the predetermined level. In the present invention, a determination condition of whether the impedance reaches the predetermined level is not limited in particular.

The end signals END1 and END2 are supplied via EXOR gates 171 and 172 to latch circuits 141 and 142, respectively. The EXOR gates 171 and 172 are supplied commonly with an end signal END3 outputted from the 32tCK cycle counter 162. Thus, when the end signal END1 becomes active before the end signal END3 becomes active, the first impedance code counted in the up-down counter 140 is latched to the latch circuit 141. Similarly, when the end signal END2 becomes active before the end signal END3 becomes active, the second impedance code counted in the up-down counter 140 is latched to the latch circuit 142.

When the end signal END3 becomes active before the end signals END1 and END2 become active, the first and second impedance codes counted in the up-down counter 140 are latched to the latch circuits 141 and 142, respectively.

The 32tCK cycle counter 162 is a circuit which activates the end signal END3 in response to a lapse of 32 clock cycles since issuance of the calibration command, and serves a role of a second end-determining circuit. In the first embodiment, a calibration periods executed in response to the calibration command are defined as 64 clock cycles (=64tCK). Accordingly, the 32tCK cycle counter 162 activates the end signal END3 at a point of a lapse of a half of the calibration period (at a point of a lapse of 32 clock cycles from a start of the calibration), and again activates the end signal END3 at a point of an end of the calibration period (at a point of a lapse of 64 clock cycles from the start of the calibration)

Thus, the end signal END3 is supplied via the EXOR gates 171 and 172 to the latch circuits 141 and 142. As a result, irrespective of the impedances of the replica buffers 110 and 130 reaching the predetermined level, the first and second impedance codes are forcibly latched at a point of lapses of 32 clock cycles and 64 clock cycles from the start of the calibration operation.

As described above, the end signal END3 is supplied to the up-down counter 140, and when this becomes active, the operation modes of the up-down counter 140 are switched. Accordingly, at a point of lapses of 32 clock cycles and 64 clock cycles from the start of the calibration, the operation modes are switched. In the first embodiment, in a first half of the calibration period, the operation mode in which the first impedance code is changed is selected, and in a second half of the calibration period, the operation mode in which the second impedance code is changed is selected.

The calibration circuit 100 according to the first embodiment has a start-code generating circuit 180. The start-code generating circuit 180 supplies a start code to the up-down counter 140 in response to issuance of the calibration command ZQCS. The start code supplied to the up-down counter 140 is the impedance code held in the latch circuits 141 and 142.

Thus, a configuration of the calibration circuit 100 is described. When the calibration circuit 100 is operated actually, an external resistor R is connected to the calibration terminal ZQ, as shown in FIG. 1.

An operation of the calibration circuit 100 is explained next.

Figure 4:
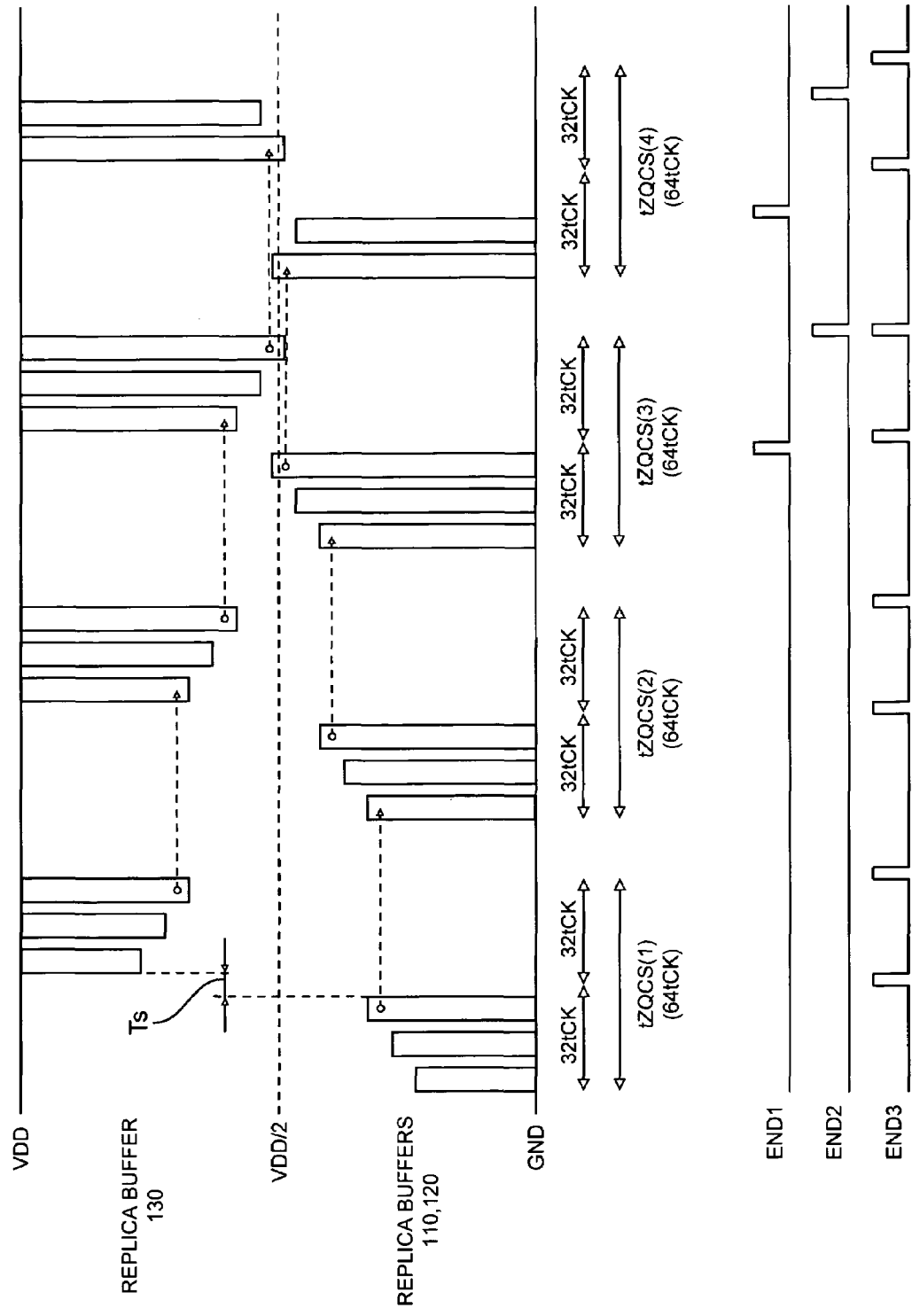
FIG. 4 is a schematic waveform chart showing one example of an output change of the replica buffer during the calibration operation.

FIG. 4 is a schematic waveform chart showing one example of an output change of the replica buffer during the calibration operation. In FIG. 4, also generation timings of the end signals END1 to END3 are shown.

An example shown in FIG. 4 shows a case that the impedances of the replica buffers 110, 120, and 130 are higher than a target value, and thus the potential of the calibration terminal ZQ is lower than the reference potential (=VDD/2) which is a target value and the potential of the contact node A is higher than the reference potential.

When a first calibration command is issued, the start-code generating circuit 180 supplies the first impedance code held in the latch circuit 141 to the up-down counter 140. Upon issuing the calibration command, in the up-down counter 140, the first operation mode of counting up or counting down the first impedance code is selected, and thus a content of the latch circuit 141 is fetched as the first impedance code.

Thereafter, the comparator circuit 151 is used to compare the potential of the calibration terminal ZQ and the reference potential, and according to a result thereof, the first impedance code is counted up or counted down by the up-down counter 140. In the example shown in FIG. 4, the impedance of the replica buffer 110 is high, and thus the potential of the calibration terminal ZQ is lower than the reference potential. Accordingly, the first impedance code is counted up. As a result, the impedance of the replica buffer 110 is decreased by one step, and the potential of the calibration terminal ZQ also is increased by one step.

Such operations are executed for a plurality of cycles (3 cycles in the example shown in FIG. 4) and after a lapse of 32 clock cycles since the issuance of the calibration command, the 32tCK cycle counter 162 activates the end signal END3. In response thereto, the current impedance code is latched to the latch circuit 141. The latched impedance code is reflected also in the replica buffer 120. Thereby, the impedance of the replica buffer 120 becomes substantially equal to that of the replica buffer 110.

In response to the end signal END3 being activated, the operation modes of the up-down counter 140 are switched to the second operation mode of counting up or counting down the second impedance code. The start-code generating circuit 180 supplies the second impedance code held in the latch circuit 142 to the up-down counter 140. Thereby, a content of the latch circuit 142 is fetched to the up-down counter 140 as the second impedance code.

Thereafter, the comparator circuit 152 is used to compare the potential of the contact node A and the reference potential, and according to a result thereof, the second impedance code is counted up or counted down by the up-down counter 140. In the example shown in FIG. 4, the impedance of the replica buffer 130 is high, and thus the potential of the contact node A is higher than the reference potential. Accordingly, the second impedance code is counted up. As a result, the impedance of the replica buffer 130 is decreased by one step, and the potential of the contact node A also is decreased by one step.

Such operations are executed for a plurality of cycles (3 cycles in the example shown in FIG. 4) and after a lapse of 64 clock cycles since the issuance of the calibration command, the 32tCK cycle counter 162 again activates the end signal END3. In response thereto, the current impedance code is latched to the latch circuit 142.

Thus, a first calibration period tZQCS(1) is ended. During the period, outputs of the comparator circuits 151 and 152 do not change even once. Accordingly, the end-determining circuit 161 does not generate the end signals END1 and END2. However, as described above, irrespective of the generation of the end signals END1 and END2, at a point of lapses of 32 clock cycles and 64 clock cycles from the start of the calibration, the first and second impedance codes are forcibly latched, and thus the calibration failure does not occur and a final code is held. That is, a subsequent calibration operation can be executed from a previous point.

When the second and third calibration commands are issued and the calibration operation is advanced in response thereto, the potential of the calibration terminal ZQ and that of the contact node A reach the reference potential at last. In the example shown in FIG. 4, at the third calibration operation, the potential of the calibration terminal ZQ and that of the contact node A reach the reference potential. That is, at the third calibration operation, an impedance adjustment is successful. When the impedance adjustment is successful, the end-determining circuit 161 generates the end signals END1 and END2, and in response thereto, the latch circuits 141 and 142 latch the current impedance code.

Thus, in the first embodiment, during one calibration period, even when the impedance adjustment is not completed, the last impedance code is held in the latch circuits 141 and 142 without discarding the impedance code. Thereby, even when since a frequency of the external clock is high, one calibration period tZQCS is short, a plurality of number of times of calibration periods are utilized to enable execution of the correct calibration operation.

In the first embodiment, when the end-determining circuit 161 generates the end signals END1 and END2 before the 32tCK cycle counter 162 generates the end signal END3, the impedance adjustment of the replica buffer is ended at this point and the latch circuits 141 and 142 are caused to latch the impedance code. As a result, it becomes possible to reduce an adjustment error caused due to an unnecessary continuation of the impedance adjustment.

That is, in the example shown in FIG. 4, an operation in response to the fourth calibration command is ended by the two impedance adjustments both on a pull-up side and a pull-down side. Accordingly, the adjustment error is contained within a range of ±1 relative to the impedance code most approximate to the reference potential. In this error, provided that the impedance code at a time of ending the third calibration operation shown in FIG. 4 is an optimal value, for example, the impedance code at a time of ending a fourth calibration operation is a value deviated by one step from the optimal value. It is safe to say that such an error occurs inevitably as long as a magnitude comparison using the comparator circuit is performed.

On the other hand, when the end-determining circuit 161 is not used, even after the impedance of the replica buffer reaches the optimal value, the adjustment operation is continued during a predetermined period, and thus the impedance code obtained finally is not always the optimal value. That is, the impedance code obtained finally probably is a value deviated by one step. Such deviation occurs on the pull-up side first, and then, the impedance adjustment is so performed that the pull-down side matches the pull-up side on which the impedance is deviated, and thus the deviation can probably become greater on the pull-down side. As a result, the adjustment error can probably be enlarged to about ±2 relative to the impedance code most approximate to the reference potential.

In the calibration circuit 100 according to the first embodiment, such problems do not occur. Accordingly, a more exact impedance adjustment can be enabled.

Further, in the first embodiment, during one calibration period, the impedance adjustment of the replica buffers 110 and 120 on the pull-up side and the impedance adjustment of the replica buffer 130 on the pull-down side are both performed. As a result, there is also an advantage that a mismatch of the impedance between the pull-up side and the pull-down side doest not easily occur.

Figure 5:
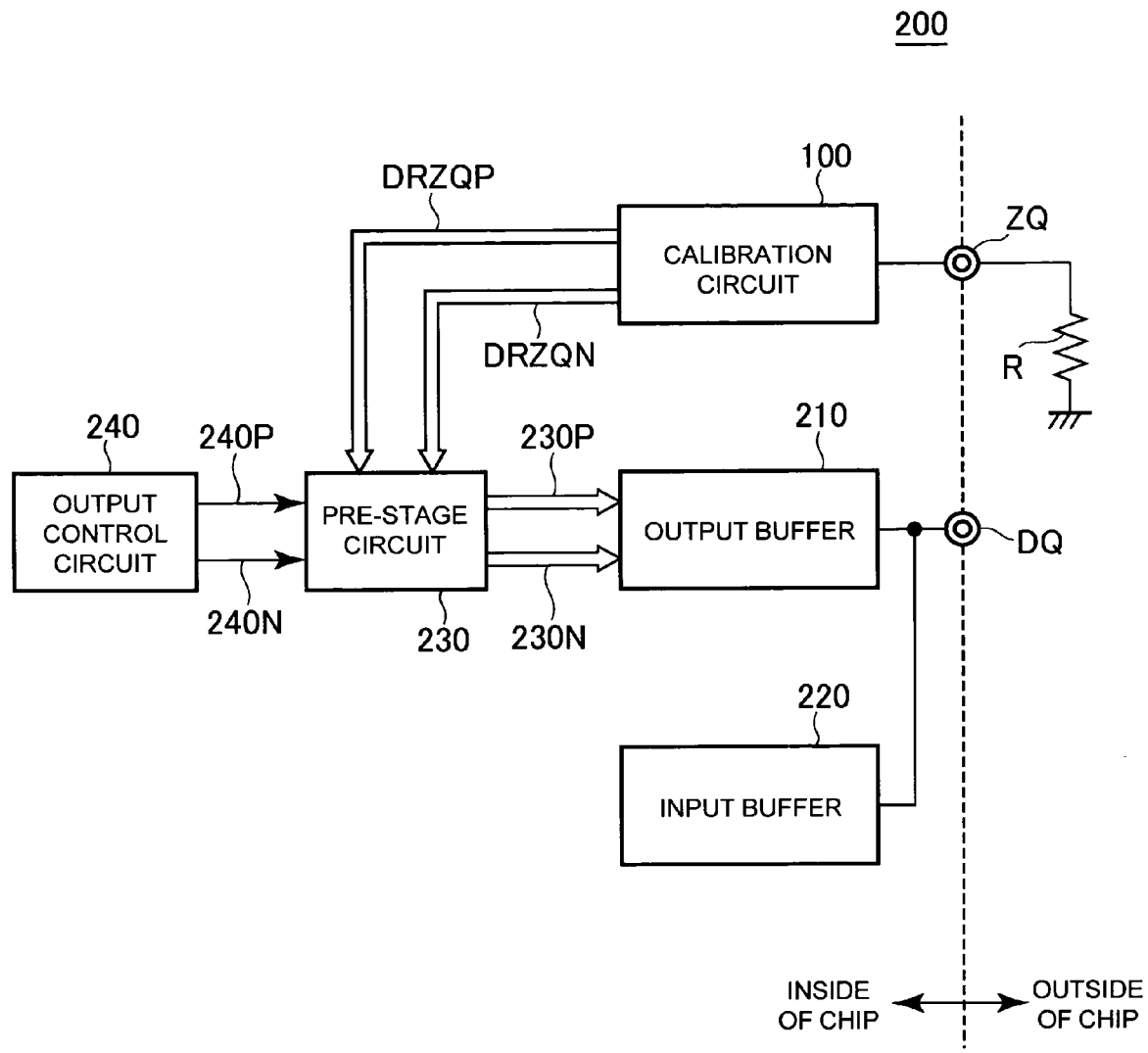
FIG. 5 is a block diagram of main parts of a semiconductor device that includes the calibration circuit shown in FIG. 1.

FIG. 5 is a block diagram of main parts of a semiconductor device 200 that includes the calibration circuit 100.

The semiconductor device 200 shown in FIG. 5 includes, in addition to the calibration circuit 100, an output buffer 210 and input buffer 220 that are connected to a data input/output terminal DQ. Since the configuration of the input buffer 220 is not directly relevant to the scope of the present invention, its description will be omitted in the specification.

The operation of the output buffer 210 is controlled by operation signals 230P and 230N provided from a pre-stage circuit 230. As shown in FIG. 5, the impedance control signals DRZQP and DRZQN provided from the calibration circuit 100 are provided to the pre-stage circuit 230.

Figure 6:
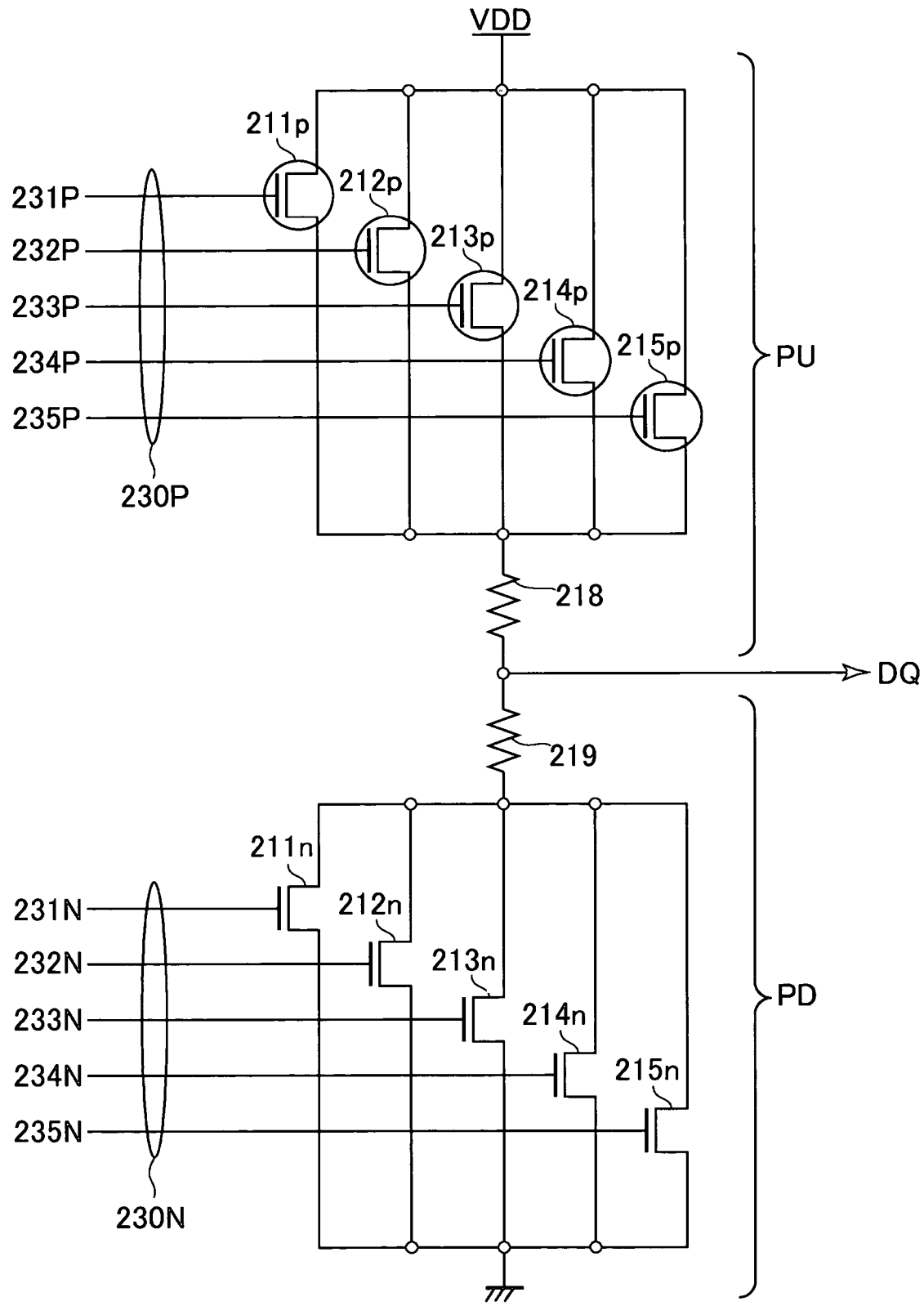
FIG. 6 is a circuit diagram of the output buffer 210.

FIG. 6 is a circuit diagram of the output buffer 210.

As shown in FIG. 6, the output buffer 210 includes five P-channel MOS transistors 211p to 215p connected in parallel and five N-channel MOS transistors 211n to 215n connected in parallel. Resistors 218 and 219 are serially connected between the transistors 211p to 215p and the transistors 211n to 215n. The connection point of the resistor 218 and the resistor 219 is connected to the data input/output terminal DQ.

Five operation signals 231P to 235P that constitute an operation signal 230P are provided to the gates of the transistors 211p to 215p. Five operation signals 231N to 235N that constitute an operation signal 230N are provided to the gates of the transistors 211n to 215n. Ten transistors in the output buffer 210 are on-off controlled separately by ten operation signals 231P to 235P and 231N to 235N. The operation signals 231P to 235P constitute the operation signal 230P, and the operation signals 231N to 235N constitute the operation signal 230N.

In the output buffer 210, a pull-up circuit PU formed by the P-channel MOS transistors 211p to 215p and the resistor 218 has the same circuit configuration as the replica buffer 110 (120) shown in FIG. 2. A pull-down circuit PD formed by the N-channel MOS transistors 211n to 215n and the resistor 219 has the same circuit configuration as the replica buffer 130 shown in FIG. 3.

Accordingly, the parallel circuit of the transistors 211p to 215p and the parallel circuit of the transistors 211n to 215n are designed to have e.g., 120Ω at the time of conduction. Resistance values of the resistors 218 and 219 are designed to be, e.g., 120Ω, respectively. Therefore, if either the parallel circuit of the transistors 211p to 215p or the parallel circuit of the transistors 211n to 215n is turned on, the impedance of the output buffer is 240Ω as seen from the data input/output terminal DQ.

In actual semiconductor devices, a plurality of these output buffers 210 are provided in parallel and, the output impedance is selected depending on the number of output buffers to be used. Assume that the impedance of the output buffer is indicated by X, by using Y output buffers in parallel, the output impedance is calculated as X/Y.

Figure 7:
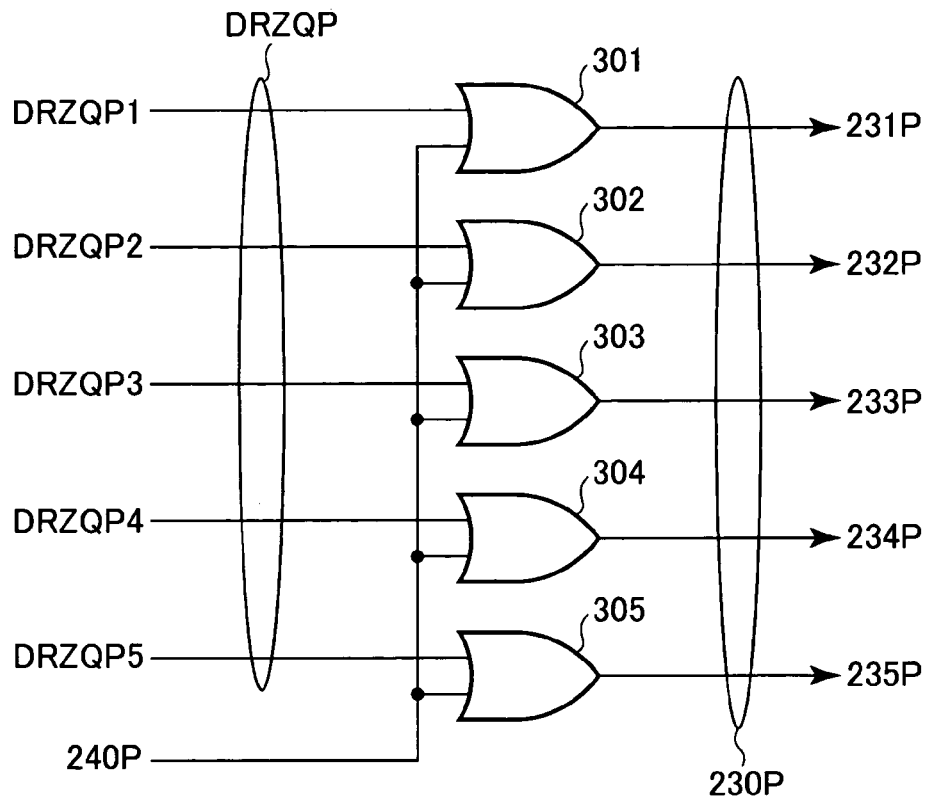
FIG. 7 is a circuit diagram of the pre-stage circuit 230.
Figure 7:
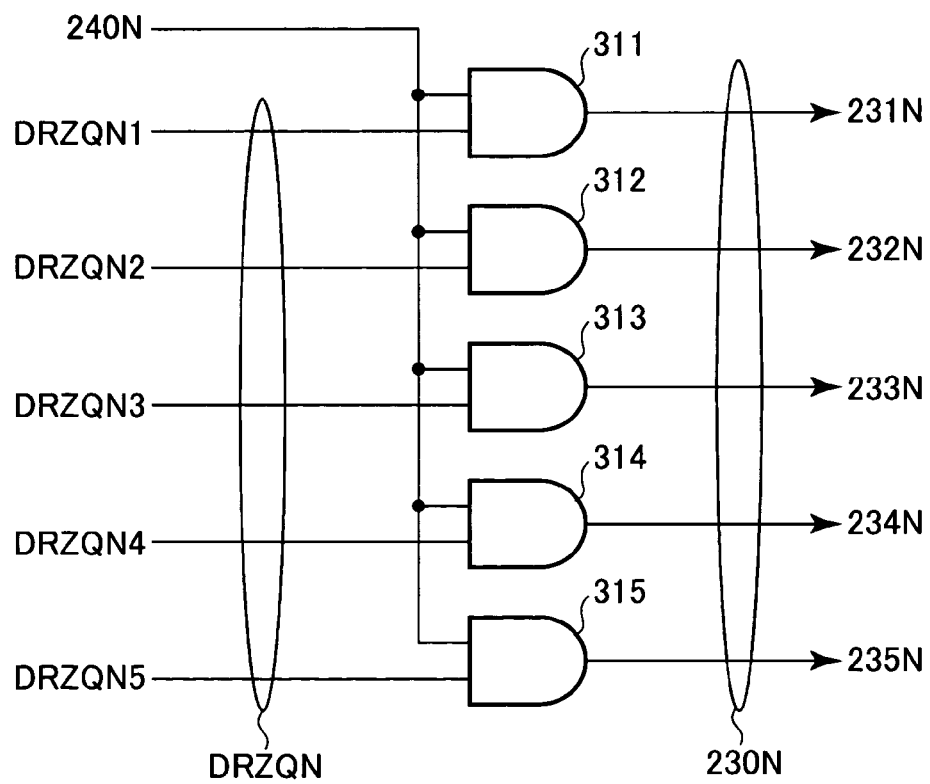

FIG. 7 is a circuit diagram of the pre-stage circuit 230.

As shown in FIG. 7, the pre-stage circuit 230 is formed by five OR circuits 301 to 305 and five AND circuits 311 to 315. A selection signal 240P from an output control circuit 240 and the impedance control signals DRZQP1 to DRZQP5 from the calibration circuit 100 are provided to the OR circuits 301 to 305. Meanwhile, a selection signal 240N from the output control circuit 240 and the impedance control signals DRZQN1 to DRZQN5 from the calibration circuit 100 are provided to the AND circuits 311 to 315.

The selection signals 240P and 240N that are the outputs of the output control circuit 240 are controlled depending on logic values of data to be outputted from the data input/output terminal DQ. Specifically, when a high level signal is outputted from the data input/output terminal DQ, the selection signals 240P and 240N are set to low level. When a low level signal is outputted from the data input/output terminal DQ, the selection signals 240P and 240N are set to high level. When ODT (On Die Termination) that the output buffer 210 is used as a terminal resistor is utilized, the selection signal 240P is set to low level and the selection signal 240N is set to high level.

Operation signals 231P to 235P (=230P) that are the outputs of the OR circuits 301 to 305 and the operation signals 231N to 235N (=230N) that are the outputs of the AND circuits 311 to 315 are provided to the output buffer 210 as shown in FIG. 5.

The configuration of the semiconductor device 200 has been described. With respect to the operation of the calibration circuit 100 according to the present embodiment, the output buffer 210 can operate the same impedance adjusted by the calibration circuit 100.

Figure 8:
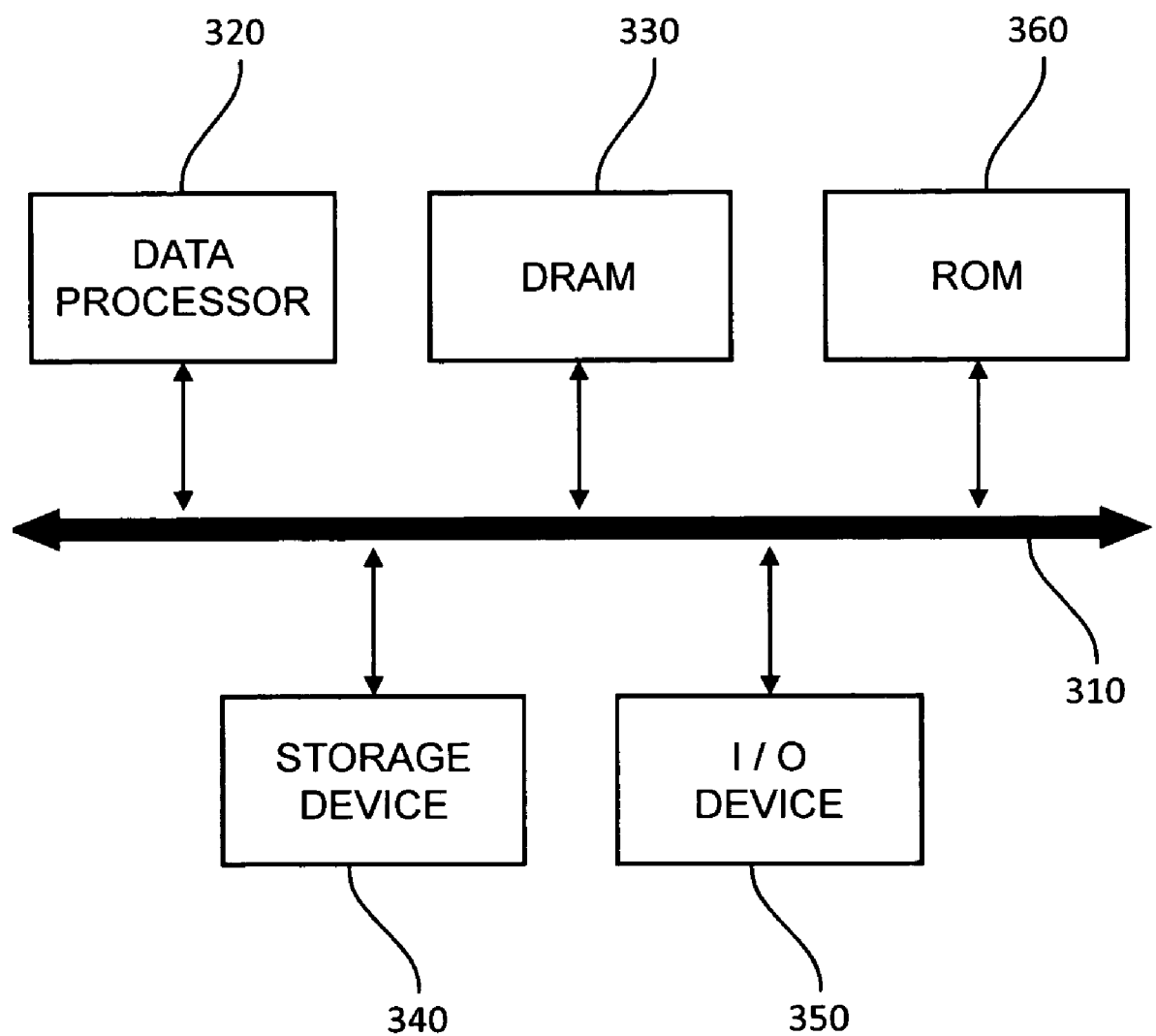
FIG. 8 is a block diagram showing a configuration of a data processing system according to a preferred embodiment of the present invention.

FIG. 8 is a block diagram showing a configuration of a data processing system 300 using a semiconductor device according to a preferred embodiment of the present invention. The semiconductor device according to the present embodiment is a DRAM.

The data processing system 300 shown in FIG. 8 includes a data processor 320 and a semiconductor device (DRAM) 330 according to the present embodiment connected to each other via a system bus 310. The data processor 320 includes a microprocessor (MPU) and a digital signal processor (DSP), for example. However, the constituent elements of the data processor 320 are not limited to these. In FIG. 8, while the data processor 320 and the DRAM 330 are connected to each other via the system bus 310, to simplify the explanation, the data processor 320 and the DRAM 330 can be connected to each other via a local bus without via the system bus 310.

While only one set of the system bus 310 is drawn to simplify the explanation in FIG. 8, the system bus can be set in series or in parallel via the connector according to need. In the memory system data processing system shown in FIG. 8, a storage device 340, an I/O device 350, and a ROM 360 are connected to the system bus 310. However, these are not necessarily essential constituent elements of the invention.

The storage device 340 includes a hard disk drive, an optical disk drive, and a flash memory. The I/O device 350 includes a display device such as a liquid-crystal display, and an input device such as a keyboard and a mouse. The I/O device 350 may be any one of the input device and the output device. Further, while each one constituent element is drawn in FIG. 8 to simplify the explanation, the number of each constituent element is not limited to one, and may be one or two or more.

A second embodiment of the present invention is explained next.

Figure 9:
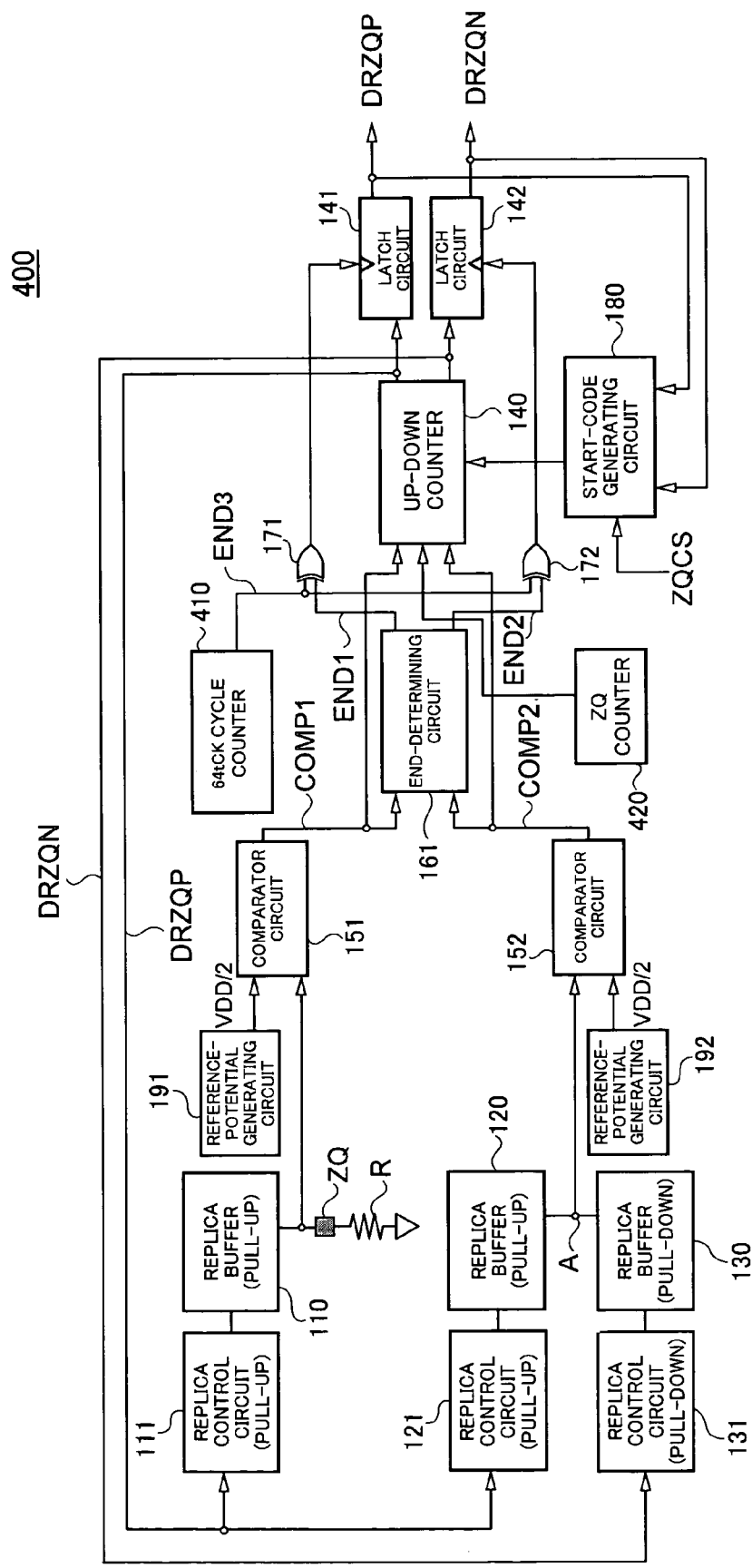
FIG. 9 is a circuit diagram of a calibration circuit according to a second embodiment of the present invention.

FIG. 9 is a circuit diagram of a calibration circuit 400 according to the second embodiment.

As shown in FIG. 9, the calibration circuit 400 differs from the calibration circuit 100 shown in FIG. 1 in that: the 32tCK cycle counter 162 shown in FIG. 1 is replaced by a 64tCK cycle counter 410; a ZQ counter 420 is added; and operation modes of the up-down counter 140 are switched by output signal of the ZQ counter 420. Other features of the calibration circuit 400 are identical to those of the calibration circuit 100 shown in FIG. 1, and therefore the same elements are designated by the same reference numerals and redundant explanations will be omitted.

The 64tCK cycle counter 410 is a circuit which activates the end signal END3 in response to a lapse of 64 clock cycles since issuance of the calibration command, and serves a role of the second end-determining circuit. In the second embodiment, a calibration periods executed in response to the calibration command are 64 clock cycles (=64tCK), and accordingly, the 64tCK cycle counter 410 activates the end signal END3 at a point that the calibration period is ended (at a point after a lapse of 64 clock cycles from a start of the calibration).

On the other hand, the ZQ counter 420 is a sort of a flag inverted each time the calibration command is issued, and is used for selecting the operation modes of the up-down counter 140.

Figure 10:
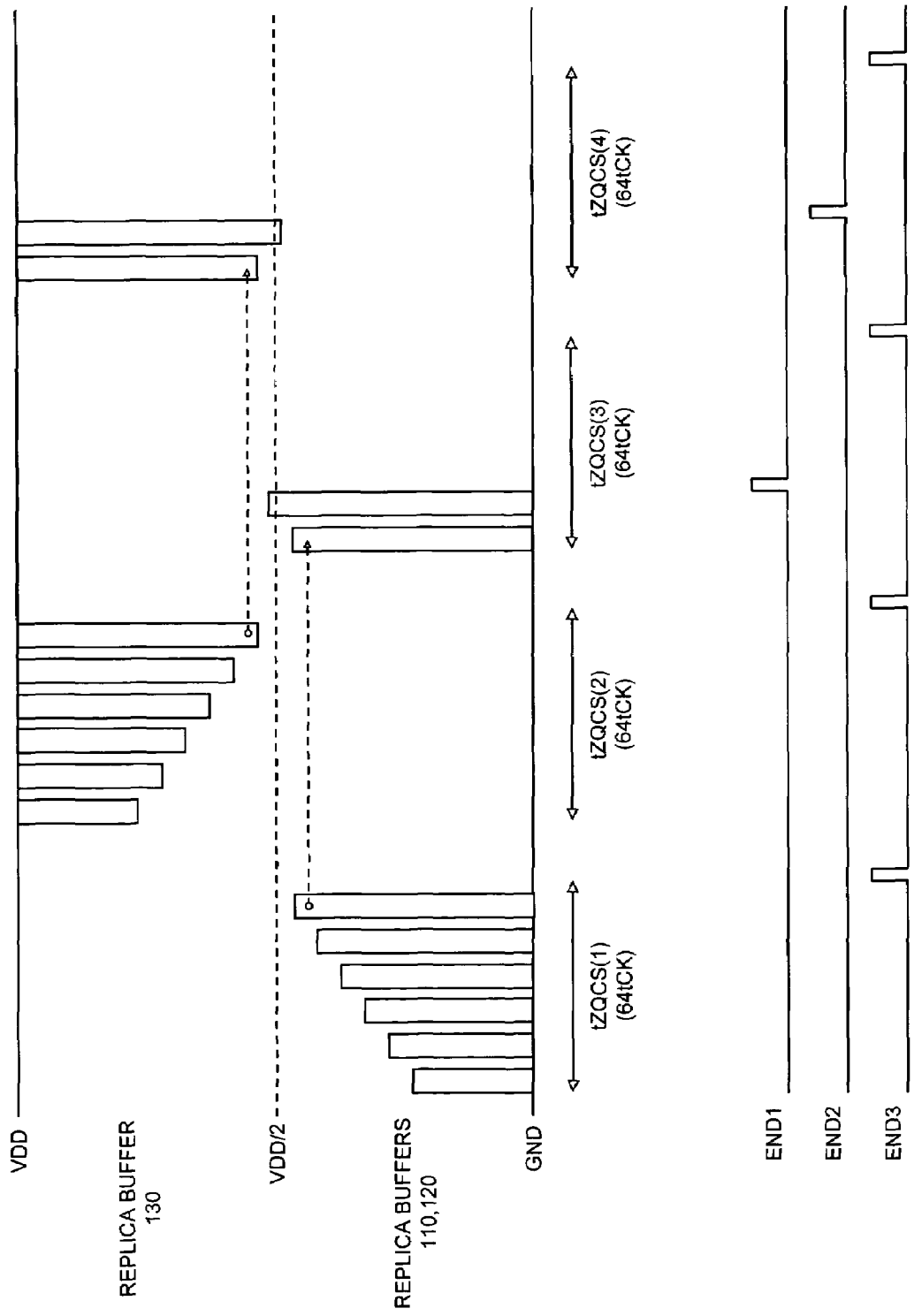
FIG. 10 is a schematic waveform chart showing one example of an output change of the replica buffer in the second embodiment.

FIG. 10 is a schematic waveform chart showing one example of an output change of the replica buffer in the second embodiment. In FIG. 10, generation timings of the end signals END1 to END3 are also indicated.

An example shown in FIG. 10 shows, similar to the example shown in FIG. 4, a case that the impedances of the replica buffers 110, 120, and 130 are higher than a target value, and thus the potential of the calibration terminal ZQ is lower than the reference potential (=VDD/2) which is the target value and the potential of the contact node A is higher than the reference potential.

At a point that the first calibration command is issued, the ZQ counter 420 selects the first operation mode. Thus, the up-down counter 140 fetches the content of the latch circuit 141 as the first impedance code.

Similar to the first embodiment, the first impedance code is counted up by the up-down counter 140. As a result, the impedance of the replica buffer 110 is decreased by each step, and the potential of the calibration terminal ZQ also is increased by each step.

Such operations are executed for a plurality of cycles (6 cycles in the example shown in FIG. 10) and after a lapse of 64 clock cycles since the issuance of the calibration command, the 64tCK cycle counter 410 activates the end signal END3. In response thereto, the current impedance code is latched to the latch circuit 141. The latched impedance code is reflected also in the replica buffer 120. Thereby, the impedance of the replica buffer 120 is substantially equal to that of the replica buffer 110.

When the second calibration command is issued, the content of the ZQ counter 420 is inverted, and in the up-down counter 140, the second operation mode is selected. Thereby, the up-down counter 140 fetches the content of the latch circuit 142 as the second impedance code. Subsequently, similar to the pull-up side, the second impedance code is counted up by the up-down counter 140. As a result, the impedance of the replica buffer 130 is decreased by each step, and the potential of the contact node A also is increased by each step.

As described above, in the second embodiment, during one calibration period, both the impedance adjustment on the pull-up side and that on the pull-down side are not executed, but one of the two adjustments is alternatively executed. Accordingly, during the calibration period, a time Ts required for switching from the pull-up-side adjustment to the pull-down-side adjustment becomes unnecessary, and thus the calibration operation in which there are a fewer number of overheads can be realized.

A third embodiment of the present invention is explained next.

Figure 11:
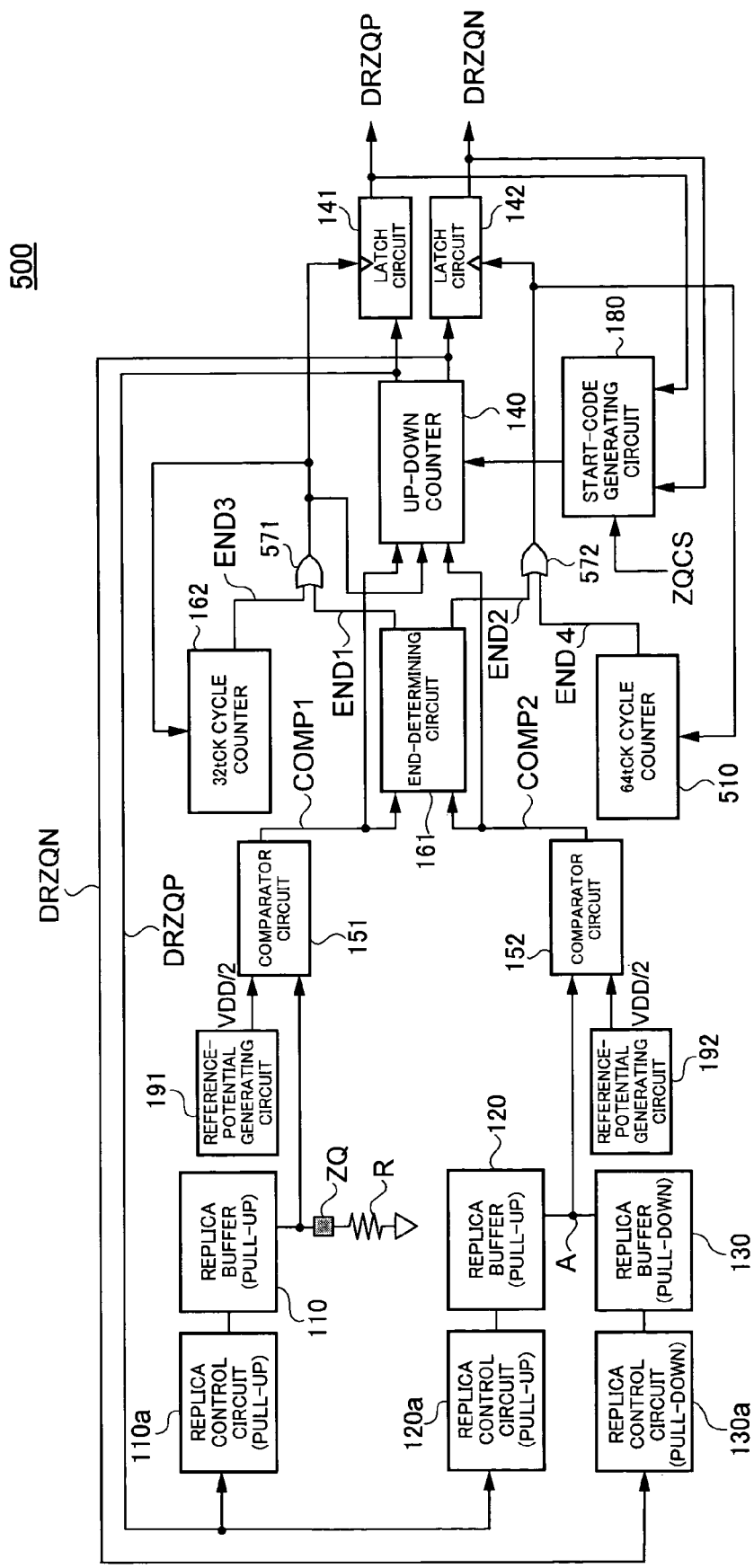
FIG. 11 is a circuit diagram of a calibration circuit according to a third embodiment of the present invention.

FIG. 11 is a circuit diagram of a calibration circuit 500 according to the third embodiment.

As shown in FIG. 11, in the calibration circuit 500, a 64tCK cycle counter 510 is added, and the EXOR gates 171 and 172 are replaced by OR gates 571 and 572. The OR gate 572 is supplied with an end signal END4 which is output of the 64tCK cycle counter 510. The 32tCK cycle counter 162 is so configured to be reset when output of the OR gate 571 is rendered active, and the 64tCK cycle counter 510 is so configured to be reset when output of the OR gate 572 is rendered active. Other features of the calibration circuit 400 are identical to those of the calibration circuit 100 shown in FIG. 1, and thus the same elements are designated by the same reference numerals and redundant explanations will be omitted.

Figure 12:
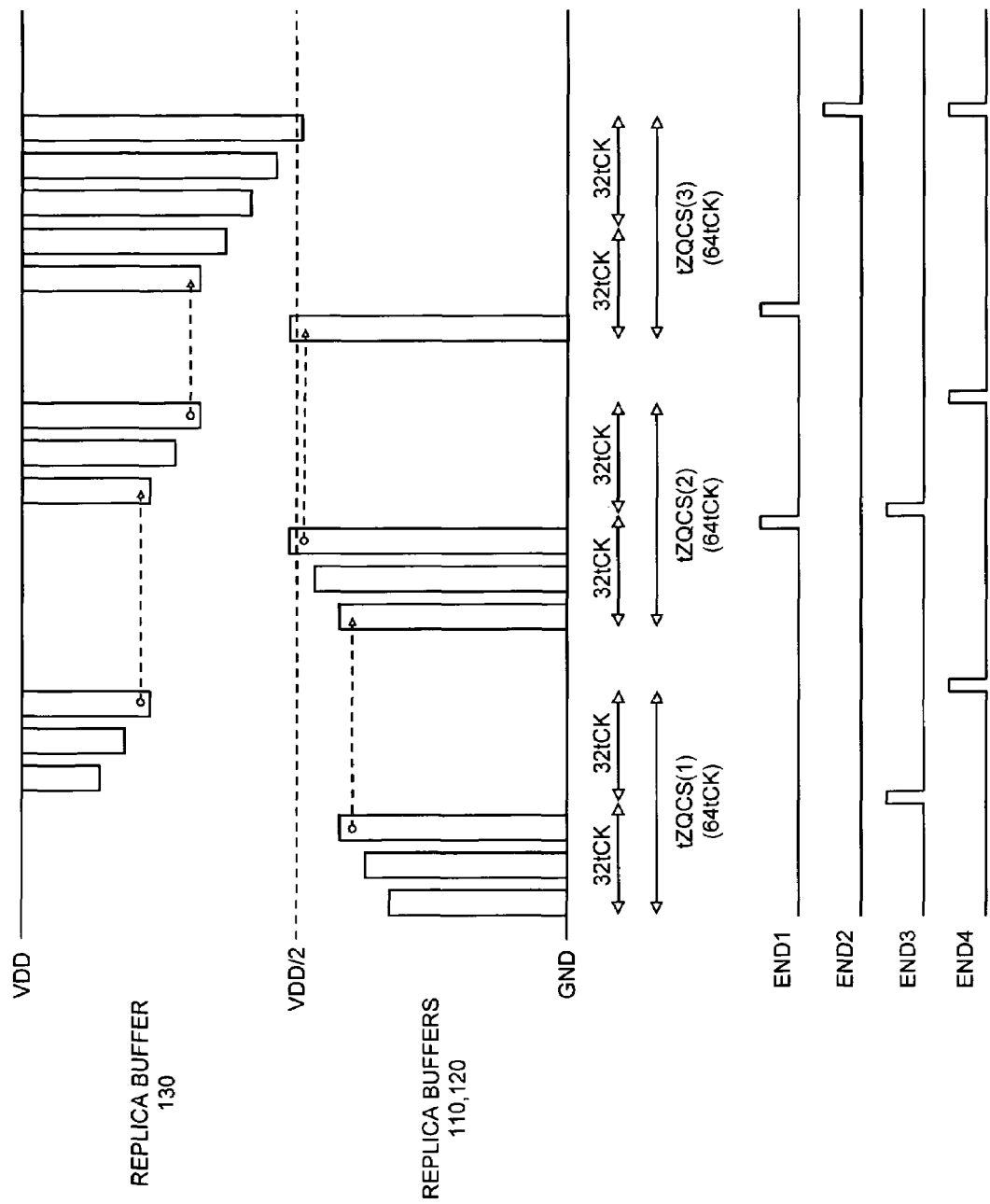
FIG. 12 is a schematic waveform chart showing one example of an output change of the replica buffer in the third embodiment.

FIG. 12 is a schematic waveform chart showing one example of an output change of the replica buffer in the third embodiment. In FIG. 12, generation timings of the end signals END1 to END4 are also shown.

An example shown in FIG. 12 shows a case that the impedances of the replica buffers 110, 120, and 130 are higher than the target value, and the replica buffers 110 and 120 are closer to the target impedance than the replica buffer 130.

The first and second calibration operations are identical to those of the calibration circuit 100 according to the first embodiment. However, in the example, the replica buffers 110 and 120 are closer to the target impedance than the replica buffer 130, and thus during the second calibration operation, the impedance adjustment of the replica buffers 110 and 120 is completed. On the contrary, the impedance of the replica buffer 130 does not reach the target value yet.

Thus, during the third calibration operation, the adjustment of the impedances of the replica buffers 110 and 120 is immediately completed without waiting for the 32tCK period. In such a case, in the third embodiment, a subject to be controlled is immediately switched to the replica buffer 130 without waiting for the 32tCK period. Thus, during the third calibration operation, the impedance adjustment of the replica buffer 130 is executed by five steps, and thereby, the target impedance can be reached early.

As described above, in the third embodiment, upon completion of the impedance adjustment on the pull-up side, the impedance adjustment on the pull-down side is immediately executed. As a result, even when there is a large deviance between the impedance on the pull-up side and that on the pull-down side, it is possible to complete the adjustment at a higher speed.

The present invention is in no way limited to the aforementioned embodiments, but rather various modifications are possible within the scope of the invention as recited in the claims, and naturally these modifications are included within the scope of the invention.

For example, it is not always necessary that the size of a transistor configuring the replica buffers 110, 120, and 130 is identical to that of a transistor configuring the output buffer 210. As long as the impedance is substantially identical, a shrunk transistor can be used.

In the above embodiments, for a parallel circuit configuring the output buffer or the replica buffer, a parallel circuit is formed by five transistors. However, the number of transistors to be connected in parallel is not limited thereto.

In the above embodiments, the impedance adjustment of the replica buffer 110 on the pull-up side is firstly performed, and thereafter, the impedance adjustment of the replica buffer 130 on the pull-down side is performed using the impedance of the replica buffer 120 as a reference. However, in the present invention, the order is not particularly limited, and the impedance adjustment can be performed from the pull-down side.

In the above embodiments, in the replica buffer 110 on the pull-up side, the impedance adjustment is performed using the external resistor R as a reference, and in the replica buffer 130 on the pull-down side, the impedance adjustment is performed using the replica buffer 120 as a reference. However, the present invention is not limited thereto. For example, it is also possible to adopt a system in which both on the pull-up side and the pull-down side, the impedance adjustment is performed using the external resistor R as a reference.

In the first and second embodiments, the EXOR gates 171 and 172 are used, and in the third embodiment, the OR gates 571 and 572 are used. However, in the first and second embodiments, the OR gate can be used instead of the EXOR gates 171 and 172, and in the third embodiment, the EXOR gate can be used instead of the OR gates 571 and 572. When the EXOR gate is used, an operation for resetting the 32tCK cycle counter 162 or the like becomes unnecessary. Thus, it is possible to simplify the control. Even when the OR gate is used, resetting the 32tCK cycle counter 162 or the like is not essential. However, when the resetting operation is not performed, if the end signal END1 becomes active before the end signal END3, the latch operation is executed twice, and thus it is necessary to configure a circuit so that the impedance code which is mistaken in the second latch operation is not latched.

What is claimed is:

1. A calibration circuit for adjusting impedances of a pull-up circuit and a pull-down circuit included in an output buffer, comprising:
   a first replica buffer having a circuit configuration substantially identical to that of one of the pull-up circuit and the pull-down circuit;
   a second replica buffer having a circuit configuration substantially identical to that of an alternate one of the pull-up circuit and the pull-down circuit;
   a counter circuit that changes first and second impedance codes each defining impedances of the first and second replica buffers;
   first and second latch circuits each holding the first and second impedance codes;
   a first end-determining circuit that activates the first latch circuit in response to an impedance of the first replica buffer reaching a predetermined level and activates the second latch circuit in response to an impedance of the second replica buffer reaching a predetermine level; and
   a second end-determining circuit that activates at least one of the first and second latch circuits in response to a lapse of a predetermined period since issuance of a calibration command, irrespective of whether the impedance of the first or second replica buffer reaches the predetermined level.

2. The calibration circuit as claimed in claim 1, wherein the counter circuit has an operation mode of changing the first impedance code and an operation mode of changing the second impedance code.

3. The calibration circuit as claimed in claim 2, wherein
   the predetermined period is substantially half a calibration period, and
   the second end-determining circuit switches the operation modes of the counter circuit in response to a lapse of the predetermined period from a start of a calibration operation.

4. The calibration circuit as claimed in claim 3, wherein the first end-determining circuit switches the operation modes of the counter circuit in response to the impedance of the first replica buffer reaching the predetermined level, irrespective of a lapse of the predetermined period since the issuance of the calibration command.

5. The calibration circuit as claimed in claim 2, wherein
   the predetermined period is substantially identical to a calibration period, and
   the operation modes of the counter circuit are switched each time the calibration command is issued.

6. A semiconductor device comprising an output buffer and a calibration circuit for adjusting impedances of a pull-up circuit and a pull-down circuit included in the output buffer, the calibration circuit including:
   a first replica buffer having a circuit configuration substantially identical to that of one of the pull-up circuit and the pull-down circuit;
   a second replica buffer having a circuit configuration substantially identical to that of an alternate one of the pull-up circuit and the pull-down circuit;
   a counter circuit that changes first and second impedance codes each defining impedances of the first and second replica buffers;
   first and second latch circuits each holding the first and second impedance codes;
   a first end-determining circuit that activates the first latch circuit in response to an impedance of the first replica buffer reaching a predetermined level and activates the second latch circuit in response to an impedance of the second replica buffer reaching a predetermine level; and
   a second end-determining circuit that activates at least one of the first and second latch circuits in response to a lapse of a predetermined period since issuance of a calibration command, irrespective of whether the impedance of the first or second replica buffer reaches the predetermined level.

7. A data processing system comprising a data processor and a semiconductor device coupled to the data processor, wherein the semiconductor device includes an output buffer and a calibration circuit for adjusting impedances of a pull-up circuit and a pull-down circuit included in the output buffer, the calibration circuit including:
   a first replica buffer having a circuit configuration substantially identical to that of one of the pull-up circuit and the pull-down circuit;

a second replica buffer having a circuit configuration substantially identical to that of an alternate one of the pull-up circuit and the pull-down circuit;

a counter circuit that changes first and second impedance codes each defining impedances of the first and second replica buffers;

first and second latch circuits each holding the first and second impedance codes;

a first end-determining circuit that activates the first latch circuit in response to an impedance of the first replica buffer reaching a predetermined level and activates the second latch circuit in response to an impedance of the second replica buffer reaching a predetermine level; and a second end-determining circuit that activates at least one of the first and second latch circuits in response to a lapse of a predetermined period since issuance of a calibration command, irrespective of whether the impedance of the first or second replica buffer reaches the predetermined level.

* * * * *